US008485230B2

(12) United States Patent
Laor et al.

(10) Patent No.: US 8,485,230 B2
(45) Date of Patent: Jul. 16, 2013

(54) GAS DELIVERY SYSTEM

(75) Inventors: Yuval Laor, Boulder, CO (US); Herzel Laor, Boulder, CO (US)

(73) Assignee: Laor Consulting LLC, Denver, CO (US)

( * ) Notice: Subject to any disclaimer, the term of this patent is extended or adjusted under 35 U.S.C. 154(b) by 0 days.

(21) Appl. No.: 13/608,259

(22) Filed: Sep. 10, 2012

(65) Prior Publication Data

US 2013/0061759 A1    Mar. 14, 2013

Related U.S. Application Data

(60) Provisional application No. 61/532,115, filed on Sep. 8, 2011.

(51) Int. Cl.
*F16L 9/00*    (2006.01)

(52) U.S. Cl.
USPC ...... 138/177; 138/37; 138/DIG. 11; 366/336; 366/338

(58) Field of Classification Search
USPC ............. 138/177, 178, DIG. 11; 366/338, 366/336
See application file for complete search history.

(56) References Cited

U.S. PATENT DOCUMENTS

| 3,459,377 | A | * | 8/1969 | Van Der Hulse | ............ | 239/394 |
| 4,410,281 | A | * | 10/1983 | Crookes | ............ | 366/341 |
| 4,422,773 | A | * | 12/1983 | Cassaday et al. | ............ | 366/341 |
| 4,666,675 | A | * | 5/1987 | Parker et al. | ............ | 422/147 |
| 5,004,374 | A | * | 4/1991 | Grey | ............ | 405/154.1 |
| 6,119,769 | A | * | 9/2000 | Yu et al. | ............ | 165/109.1 |
| 6,331,072 | B1 | * | 12/2001 | Schierholz et al. | ............ | 366/338 |
| 7,045,060 | B1 | * | 5/2006 | Liles et al. | ............ | 210/199 |

OTHER PUBLICATIONS

Joule—Thomson effect; From Wikipedia, the free encyclopedia; Downloaded Aug. 21, 2011.
Technology backgrounder: Atomic Layer Deposition; IC Knowledge LLC 2004.
Cyclonic separation; From Wikipedia, the free encyclopedia; Downloaded Aug. 31, 2011.
Chemical vapor deposition; From Wikipedia, the free encyclopedia; Downloaded Sep. 4, 2011.

* cited by examiner

*Primary Examiner* — Patrick F Brinson
(74) *Attorney, Agent, or Firm* — A.C. Entis-IP Ltd.

(57) ABSTRACT

A gas delivery pipe for transmitting a gas, the pipe comprising: a wall defining a lumen of the pipe; an inlet aperture through which gas flows into the pipe; an outlet aperture through which gas flows out of the pipe; wherein the pipe has an index, SI, characterizing a degree to which the pipe is serpentine that is equal to an integral of an absolute value of changes in angle of direction that a unit vector tangent to a midline of the lumen undergoes in moving along the midline from the inlet to the outlet aperture, which integral has a value greater than or about equal to 180°.

19 Claims, 6 Drawing Sheets

GAS DELIVERY SYSTEM

RELATED APPLICATIONS

The present application claims benefit under 35 U.S.C. 119(e) of U.S. Provisional Application 61/532,115 filed Sep. 8, 2011, the disclosure of which is incorporated herein by reference.

TECHNICAL FIELD

Embodiments of the invention relate to gas flow.

BACKGROUND

Various thin layer deposition processes such as atomic layer deposition (ALD) and the many different epitaxial deposition techniques, such as chemical vapor deposition (CVD), hydride vapor phase epitaxial (HVPE) processes to name a few of the large family of deposition techniques used in manufacturing semiconductor devices are known. The processes are generally performed in device referred to as a reactor. The reactor has a production chamber in which a substrate having a surface on which a layer of a desired material is to be formed is supported by a pedestal in a region of the production chamber referred to as a "growth zone". A gas delivery system in communication with the production chamber delivers precursor gases to the growth zone where they react and/or decompose under conditions of temperature and pressure that facilitate deposition of the desired material on the substrate surface. The reactor comprises various heating elements and pumps that are controlled to maintain regions of the production chamber and growth zone at desired temperatures and pressures.

The gas delivery system typically comprises a system of delivery flow pipes, pumps, and valves that are controlled to transport the precursor gases from their sources outside the reactor to the production chamber at desired flow rates and partial pressures. Excess quantities of precursor gases delivered to the production chamber are removed from the production chamber after delivery to the growth zone by an exhaust system. The exhaust system may comprise an exhaust flow pipe that delivers the excess precursor gases to an abatement unit, which removes toxic gas components from the excess gases before the excess gases are released to the atmosphere.

The various thin layer production processes may often be complex processes in which the quality of a deposited layer of a material is sensitively dependent on temperature, pressure and flow rates of the precursor gases used to form the layer. Generally, temperature of a precursor gas has to be maintained within an operating range of temperatures limited by lower and upper bound operating temperatures for the gas to function as required in a given deposition process. The range may be relatively small and in some instances the lower bound operating temperature may be a temperature below which the precursor gas forms an aerosol of liquid or solid particles and an upper bound operating temperature may be a temperature above which the gas undergoes pyrolysis and decomposes.

Change in gas temperature to above an advantageous upper bound operating temperature or below an advantageous lower bound operating temperature may be caused by Joule-Thomson cooling or heating as the precursor gas undergoes pressure changes in flowing through the flow pipes pumps and valves of the gas delivery system from a source to the growth zone.

SUMMARY

An embodiment of the invention relates to providing a gas flow system that maintains temperature of a gas flowing along a flow path of the system to within a desired temperature range. Optionally the gas flow system is a gas flow system that delivers a precursor gas to a reactor.

In an embodiment of the invention, the gas flow system comprises at least one flow pipe, in which the gas flows that has a wall configured to provide enhanced contact with the gas so that energy transfer between the wall and molecules of the gas that collide with the wall contributes advantageously to maintaining temperature of the gas within a desired operating temperature range. Contact of a gas with a wall or feature of the gas flow system refers to a frequency of collisions of molecules of the gas with the wall or feature. A flow pipe configured in accordance with an embodiment of the invention to provide desired contact with the gas, that is a desired frequency of collisions between gas molecules and the flow pipe wall, may be referred to as a "contact flow pipe".

In an embodiment of the invention, the contact flow pipe may have a cross section area that increases gradually along its length to provide slow change in pressure of the gas, so that contact between the gas and the wall maintains the gas within a desired temperature range. Optionally, the contact flow pipe may be serpentine to provide enhanced contact between aerosol particles that may be carried by the precursor gas and the wall of the contact flow pipe. The enhanced contact operates to increase a probability that the aerosols will evaporate or be sublimated and removed from the precursor gas. Additionally or alternatively, to provide enhanced contact, the contact flow pipe may be configured so that a cross section of the flow pipe has a circumference equal to or greater than about five times that of a circle having a same area as the cross section. Optionally, the contact flow pipe may have a cross section area that increases gradually along the length of the flow pipe to provide enhanced contact between the gas and the wall Optionally, a region of the wall of the flow pipe is maintained at a temperature for which energy transfer between the wall and molecules of the gas that collide with the wall is advantageous for maintaining the temperature of the gas within the desired temperature operating range. The wall temperature may be determined to cause vaporization of aerosol particles of the gas that collide with the wall.

The contact flow pipe may comprise protuberances that contact the gas. In an embodiment of the invention, the protuberances are maintained at a temperature for which energy transfer between the protuberances and molecules of the gas that collide with the protuberances is advantageous for maintaining the temperature of the gas within the desired temperature operating range and/or for vaporizing or sublimating aerosol particles of the gas. Optionally, the protuberances are fin shaped, and may have an orientation that imparts a desired flow direction to the flowing gas. Optionally, the fin shaped protuberances impart a helical, rotary, or turbulent flow to the gas. Hereinafter helical or rotary flow may be referred to as rotary flow.

The gas flow system may comprise an energy source, such as an electromagnetic or acoustic energy source, that is controllable to add energy to the gas to maintain the gas at a desired temperature. In an embodiment of the invention, the gas flow system comprises a temperature sensor that acquires measurements of the temperature of the gas and a controller that controls temperature of the wall or the energy source responsive to the acquired measurements.

In an embodiment of the invention, changes in pressure of a first gas flowing in the flow system in a region of the flow path are moderated to maintain temperature of the first gas within a desired operating range by providing the region with a second gas at a pressure that moderates a rate and magnitude of expansion of the first gas.

In the discussion, unless otherwise stated, adjectives such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical features that appear in more than one figure are generally labeled with a same label in all the figures in which they appear. A label labeling an icon representing a given feature of an embodiment of the invention in a figure may be used to reference the given feature. Dimensions of features shown in the figures are chosen for convenience and clarity of presentation and are not necessarily shown to scale.

DETAILED DESCRIPTION

Figure 1:
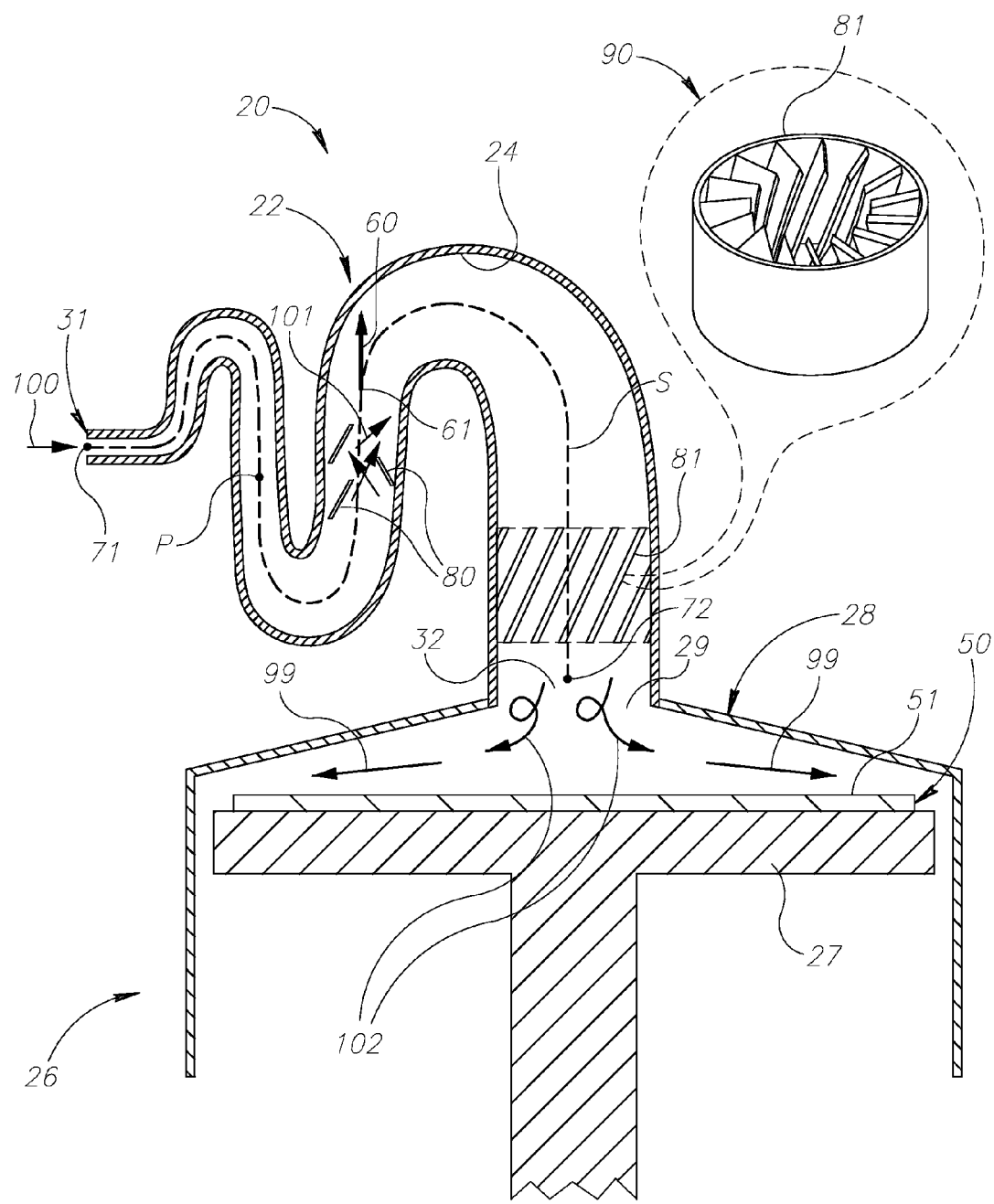
FIG. 1 schematically shows a gas flow system comprising a serpentine contact flow pipe for transporting a gas that is advantageous for maintaining a desired temperature of the gas in accordance with an embodiment of the invention.

FIG. 1 schematically shows a gas flow system 20 comprising a serpentine contact flow pipe 22 having a wall 24 for delivering a gas, optionally to a production chamber 26 of a reactor (not shown in FIG. 1), that is advantageous for maintaining a desired temperature of the gas, in accordance with an embodiment of the invention. An axis of contact flow pipe 22 along a midline of the lumen defined by wall 24 of contact flow pipe 22 is represented by a dashed line "S". Only a portion of the production chamber is shown. The gas is assumed to be a precursor gas optionally mixed with a suitable carrier gas that is to be delivered to the production chamber so that it flows over a surface 51 of a substrate 50 to form a layer (not shown) of a desired material on surface 51. Substrate 50 is supported on a pedestal 27 located in the production chamber. The production chamber 26 has a conical flow disperser 28 into which the precursor gas enters upon exit from contact flow pipe 22 via an inlet aperture 29 of flow disperser 28. Flow disperser 28 is configured to facilitate radial flow of the precursor gas that enters production chamber 26 so that it flows over substrate 50 in directions indicted by flow arrows 99. For convenience of presentation, unless indicated otherwise, a mixture of a precursor gas and a carrier gas is referred to as a precursor gas or a gas.

The precursor gas is provided by a source (not shown) of the precursor gas so that it flows into contact flow pipe 22 at an optionally relatively small inlet aperture 31 having dimensions that match an outlet aperture of the source. Flow of precursor gas into contact flow pipe 22 at inlet aperture 31 is schematically indicated by a flow arrow 100. Contact flow pipe 22 functions as a spatial adapter that transports the precursor gas from the relatively small inlet aperture 31 to a relatively large outlet aperture 32 that has dimensions adapted to dimensions and flow requirements of production chamber 26.

For example, substrate 50 shown in FIG. 1 may be a 300 mm diameter silicon semiconductor wafer, and whereas inlet aperture 31 may advantageously be 2 to 10 mm in diameter, outlet aperture 32 may advantageously be 10-50 mm in diameter to match inlet aperture 29 of flow disperser 28. Some reactor chambers are configured for processing more than one substrate at a time and for such multi-substrate production chamber outlet aperture 32 may advantageously be larger than 50 mm. In flowing from aperture 31 to aperture 32 volume of the precursor gas in general changes and undergoes expansion.

Changes in gas volume are usually accompanied by corresponding changes in temperature as a result of a Joule-Thomson effect. Generally, with expansion a gas undergoes cooling as kinetic energy of the gas is converted to potential energy in overcoming van-der-Waals attractive forces. In some situations a gas may be heated as it expands as a result of conversion of internal energy of gas molecules to kinetic energy of the gas molecules. Contact flow pipe 22 in accordance with an embodiment of the invention is configured to moderate changes in temperature of the precursor gas as it flows from relatively small inlet aperture 31 to relatively large outlet aperture 32 and undergoes increase in volume.

In an embodiment of the invention a ratio "$R_{OI}$" of area of outlet aperture 32 divided by area of inlet aperture 31 is greater than or equal to about 2. Optionally, $R_{OI}$ is greater than or equal to about 5. In some embodiments of the invention $R_{OI}$ is greater than or equal to about 10. To moderate temperature change for a contact flow pipe 22 having a given $R_{OI}$, increase in cross section area of contact flow pipe 22 with distance along the flow pipe is constrained by an upper bound constraint. If "A" is the cross sectional area of the flow pipe at any given point along the contact flow pipe, the constraint may be $(1/A)\partial A/\partial s \leq K$, where $\partial A/\partial s$ is the first derivative of A with respect to displacement "s" along axis S. In an embodiment of the invention K is less than or equal to 0.25 Optionally K is less than or equal to about 0.10. In an embodiment K is less than 0.05.

Constraining rate of increase in cross sectional area of contact flow pipe 22 in accordance with an embodiment of the invention may provide sufficient frequency of collisions of molecules of precursor gas with wall 24 of contact flow pipe 22 so that energy exchange between the wall and gas provides a desired moderation of gas temperature due to volume expansion and pressure decline.

Additionally or alternatively, in an embodiment, contact flow pipe 22 may be configured sufficiently serpentine so that aerosol particles that may be carried by the gas, because of their relatively large inertia, collide with greater frequency with wall 24 of contact flow pipe 22. The greater frequency of collision tends to evaporate or sublimate the aerosol particles and reduce their possible deleterious effects on processes that take place in production chamber 26 in forming the layer of desired material on substrate 50.

Let a measure of a degree to which flow pipe 22 is serpentine be referred to as a serpentine index (SI). SI may be defined as an integral of an absolute value of changes in angle of direction that an "imaginary" unit vector 60 tangent to axis S of contact flow pipe 22 undergoes as an origin 61 of the vector moves along the axis from the inlet aperture 31 to the outlet aperture 32.

Increasing SI tends to increase a number of times aerosol particles carried by a precursor gas flowing in contact flow pipe 22 collides with and exchanges energy with wall 24 of the contact flow pipe 22. The increased number of collisions enhances a probability that the aerosol particles will evaporate or be sublimated before they reach production chamber 26. In an embodiment of the invention SI is greater than or about equal to about 180°. Optionally SI is greater than or about equal to 360°. Optionally SI is greater than or equal to about 720°. Inspection of FIG. 1 indicates that SI for contact flow pipe 22 is equal to 630°.

In some embodiments of the invention, contact flow pipe 22 comprises mixing fins 80 that are optionally relatively thin, stave shaped deflectors that protrude inward from the wall of contact flow pipe 22 towards the axis S of the flow pipe. Mixing fins 80 tend to deflect flow of gas molecules and introduce turbulence into flow of the precursor gas that homogenizes gas temperature. Mixing fins 80 also aid in removing aerosol particles from the gas by transferring energy to aerosol particles that collide with the fins and increasing a probability that the aerosol particles evaporate or are sublimated. Flow directions and turbulence introduced by mixing fins 80 is indicated by arrows 101 representing flow of the gas in the vicinity of the mixing fins.

In an embodiment, contact flow pipe 22 comprises "cyclone" fins 81 located near exit aperture 32 of the contact flow pipe, shown magnified in an inset 90. Cyclone fins 81 introduce relatively smooth rotary flow into the precursor gas as it exits contact flow pipe 22 and enters production chamber 26. The rotary flow of the precursor gas is schematically indicated by curly flow arrows 102 aids in generating radial flow, indicated by flow arrows 99 of the precursor gas over substrate 50 after it enters production chamber 26

Production chamber 26 in an embodiment of the invention is a uniform flow production chamber. A uniform flow production chamber is configured so that precursor gas that enters the chamber from a gas flow system, such as gas flow system 20, flows with a substantially a same area cross section at all regions along its flow path through the production chamber. As a result, a uniform production chamber in accordance with an embodiment of the invention tends to prevent the formation of aerosols in the precursor gas as a result of a change in gas volume and concomitant drop in gas temperature.

Figure 2:
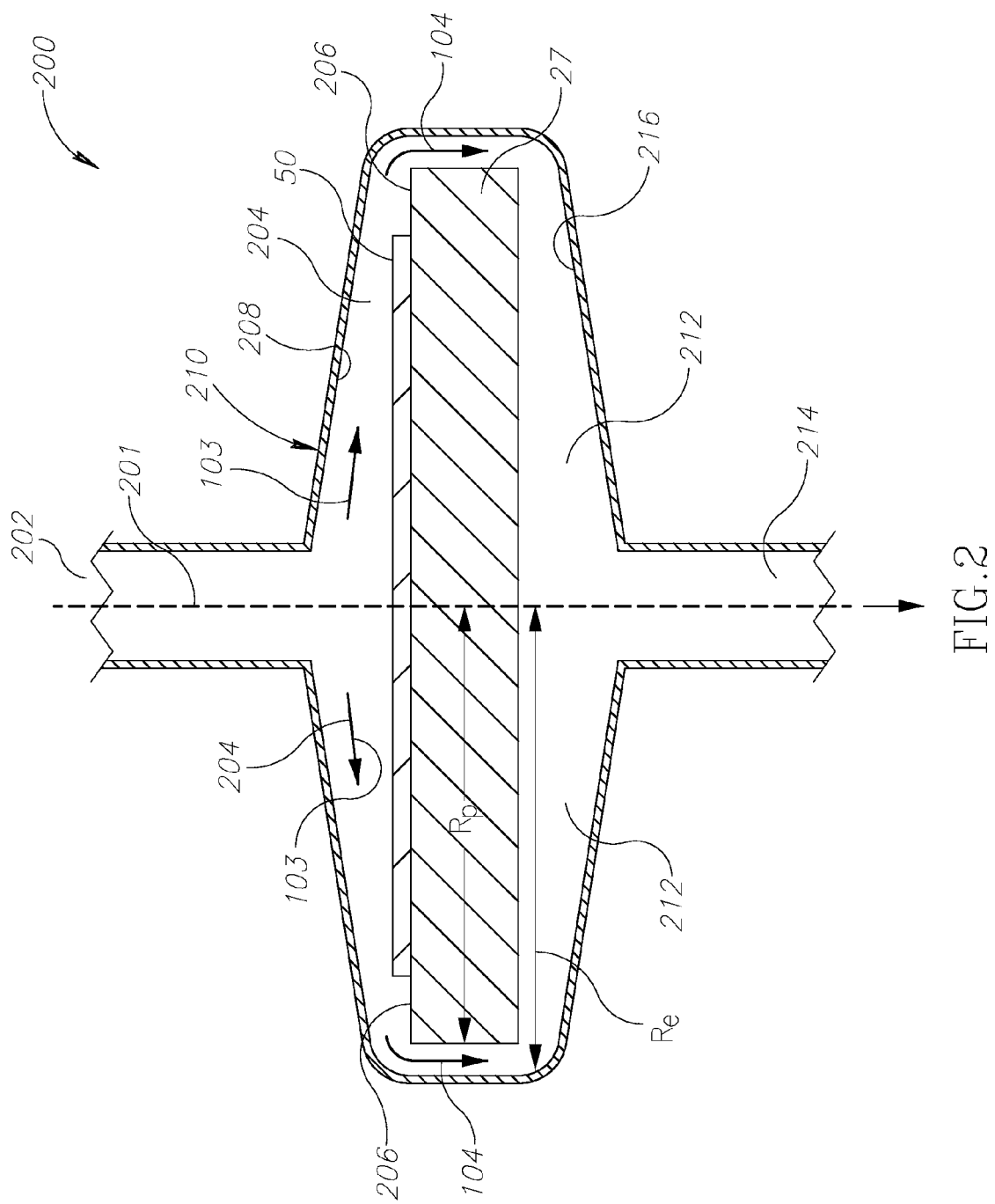
FIG. 2 schematically shows a production chamber of a reactor that may be coupled to the gas flow system shown in FIG. 1 for which gas passing through the production chamber has a flow pattern characterized by a substantially constant cross section, in accordance with an embodiment of the invention.

FIG. 2 schematically shows a uniform flow production chamber 200 of a reactor (not shown) in accordance with an embodiment of the invention. Production chamber 200 is optionally substantially rotationally symmetric about an axis of rotation 201 of the production chamber. Precursor gas optionally mixed with an inert carrier gas enters the production chamber through an inlet aperture 202 having an area, substantially equal to an outlet aperture of a gas flow system, such as outlet aperture 32 of gas flow system 20 that delivers the precursor gas to the production chamber. From inlet aperture 202, the precursor gas flows radially in a region 204 over a substrate 50 supported on a pedestal 27 towards a perimeter 206 of the pedestal. Region 204 is bounded optionally by a surface 208 of a conical flow disperser 210 and substantially a surface 212 of pedestal 27. Radial flow of the precursor gas is indicated by flow arrows 103. At the perimeter, after flowing over substrate 50 excess precursor gas flows "downwards" in directions indicated by flow arrows 104 into a region 212 from which the excess gas exhausts via an exit aperture 214 optionally to an abatement unit (not shown). Region 212 is optionally bounded by a surface 216 that is substantially a mirror image surface of surface 208.

Let "A" represent area of inlet aperture 202, "$R_O$" represent radius of the aperture, "$R_P$" radius of the perimeter of pedestal 27 and "$R_C$" radius of production chamber 200. In accordance with an embodiment, to provide constant cross section flow over substrate 50 in directions indicated by flow arrows 103, height H of surface 208 at radius $R \geq R_O$ substantially satisfies an expression $H = A/2\pi R$. To match flow cross section at perimeter 206 in direction of flow arrows 104 to flow cross section of radial flow indicated by flow arrows 103 over substrate 50, $R_C$ and $R_P$ may substantially satisfy an expression $A = \pi(R_C + R_P)(R_C - R_P)$.

Figure 3:
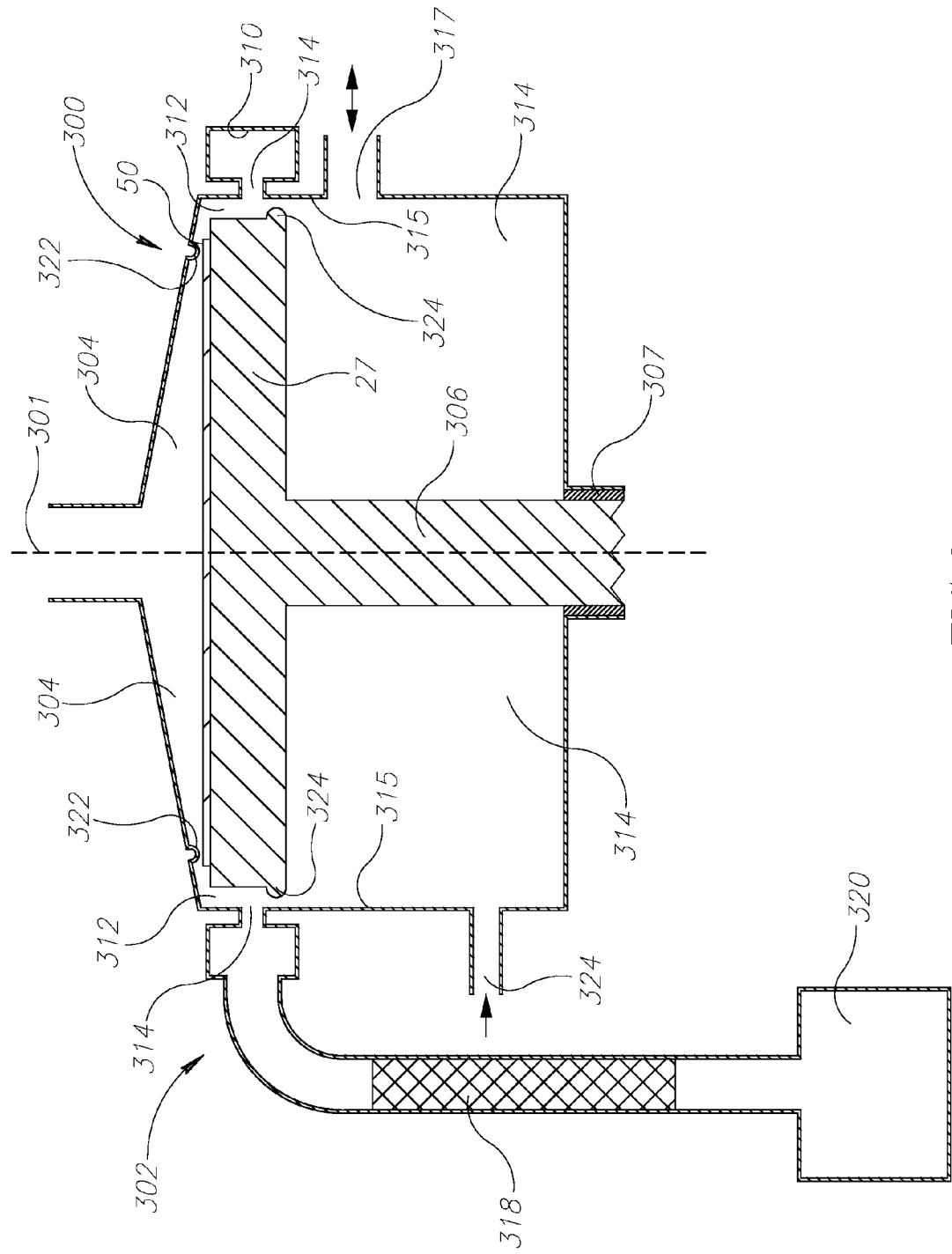
FIG. 3 schematically shows a production chamber of a reactor that may be coupled to the gas flow system shown in FIG. 1 for which flow of gas in the production chamber is controlled by gas pressure, in accordance with an embodiment of the invention.

FIG. 3 schematically shows a cross section of a production chamber 300 coupled to an exhaust system 302 that evacuates excess precursor gas after the precursor gas has entered a region 304 of production chamber 300 and passed over substrate 50, in accordance with an embodiment of the invention. Substrate 50 is supported by a pedestal 27 mounted on a pedestal stem 306 optionally journaled in a stem socket 307. The pedestal and substrate may be raised and lowered in production chamber 300 by raising and lowering the stem pedestal relative to stem socket 307 to enable insertion and removal of substrate 50 via a slit valve 317. Production chamber 300 is substantially rotationally symmetric about an axis 301.

Exhaust system 302 comprises an exhaust manifold 310, optionally rotationally symmetric with respect to axis 301 that communicates with a region 312 of production chamber 300 via a slit or plurality of holes 314 in a wall 315 of the production chamber. Precursor gas after passing over substrate 50 exits from region 304 of production chamber 300 and into region 312 and from region 312 into manifold 310 via the holes or slit. The precursor gas is evacuated from the manifold to an abatement unit 318 comprised in the exhaust system by a vacuum pump 320 that maintains region 312 at a pressure less than pressure in region 304 and pressure in a region 314 below pedestal 27. Flow barriers 322 operate to limit a rate at which precursor gas flows from region 304 into, and expands in region 312 and exhaust manifold 310. Flow barriers 324 operate to limit flow of gas between regions 312 of production chamber 300 and region 314 below pedestal 27.

In an embodiment of the invention a gas, referred to as an inert gas, that does not participate or affect reactions involving the precursor gas in region 304 of production chamber 300, is introduced via an inlet 324 into region 314 of the production chamber. Pressure of the inert gas functions to limit leakage of precursor gas into region 314 and to control and moderate a pressure differential between regions 304 and 312. Moderating the pressure differential between regions 304 and 312 moderates a rate at which precursor gas exits region 304 and flows and expands into region 312 and manifold 310 and as a result temperature changes in the gas that may be generated by a Joule-Thomson effect.

Figure 4:
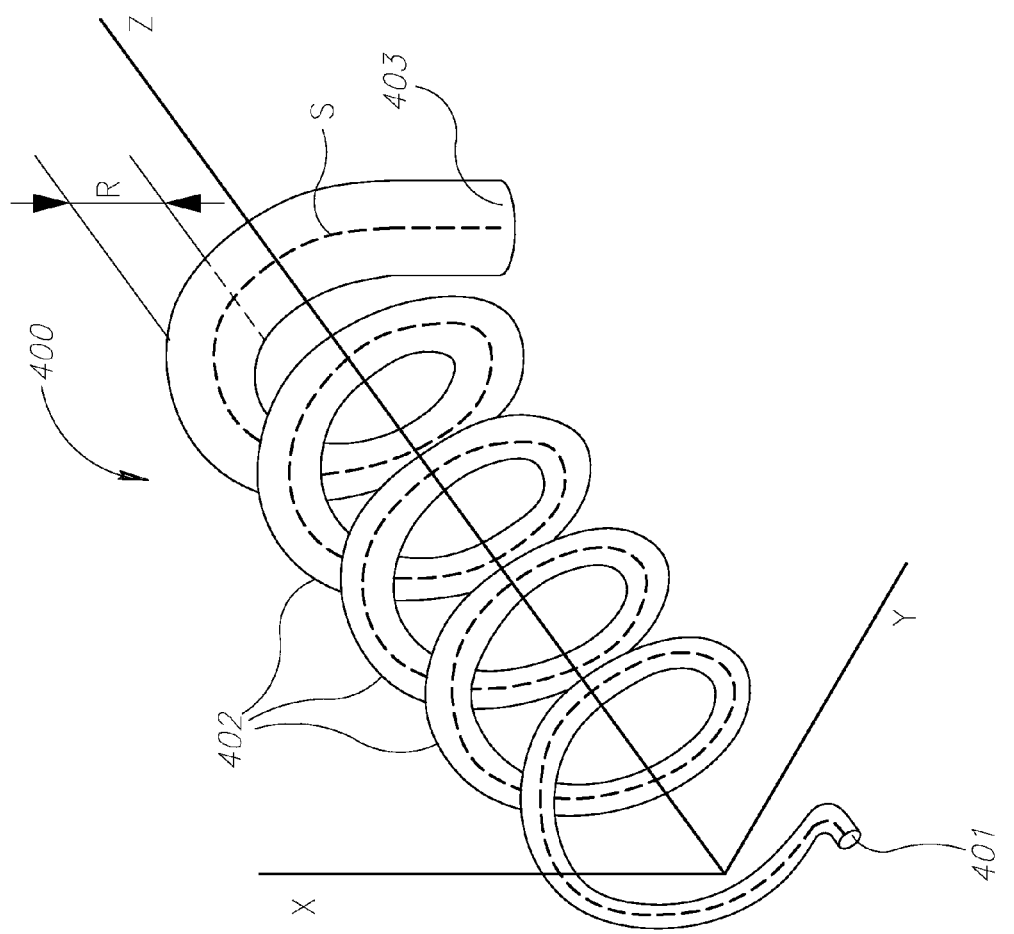
FIG. 4 schematically shows a coil contact flow pipe, for transporting a gas that is advantageous for maintaining a desired temperature of the gas in accordance with an embodiment of the invention.

FIG. 4 schematically shows another serpentine gas contact flow pipe 400 in accordance with an embodiment of the invention. Contact gas flow pipe 400 has an inlet aperture 401, at least one pipe coil 402, and an outlet aperture 403 having a diameter suitable for matching to an inlet aperture of a production chamber of a reactor such as production chamber 26 (FIG. 1). Contact flow pipe 400 has a pipe axis indicted by a dashed line "S" that passes through centers of cross sections of the contact flow pipe. Whereas contact flow pipe 400 is shown as having a circular cross section, practice of embodiments of the invention is not limited to a coil contact flow pipe having a circular cross section. A coil contact flow pipe, as well as other contact flow pipes, in accordance with an embodiment of the invention may for example, have an elliptical, rectangular, triangular, or irregular cross section. A coil contact flow pipe in accordance with an embodiment of the invention, may also have a shape of a spiral curve, such as by way of example a logarithmic or equiangular spiral, for which the coils of the spiral lie substantially in a plane.

By way of example, in FIG. 4 contact flow pipe 400 comprises five pipe coils 402 but is not limited to five pipe coils and may have less or more than five coils. A distance L between inlet aperture 401 and outlet aperture 403 is shown in FIG. 4. For convenience of visualization, contact flow pipe 400 is shown relative to a Cartesian coordinate system having x, y and z axes.

In an embodiment of the invention contact flow pipe 400 has a percent rate of change in cross section area A with distance "s" along S that satisfies the constraint discussed above, $(1/A)\partial A/\partial s \leq K$. For the exemplary five pipe coils 402 comprised in contact flow pipe 400, the contact flow pipe has a serpentine index SI substantially equal to 1,800°.

Figure 5:
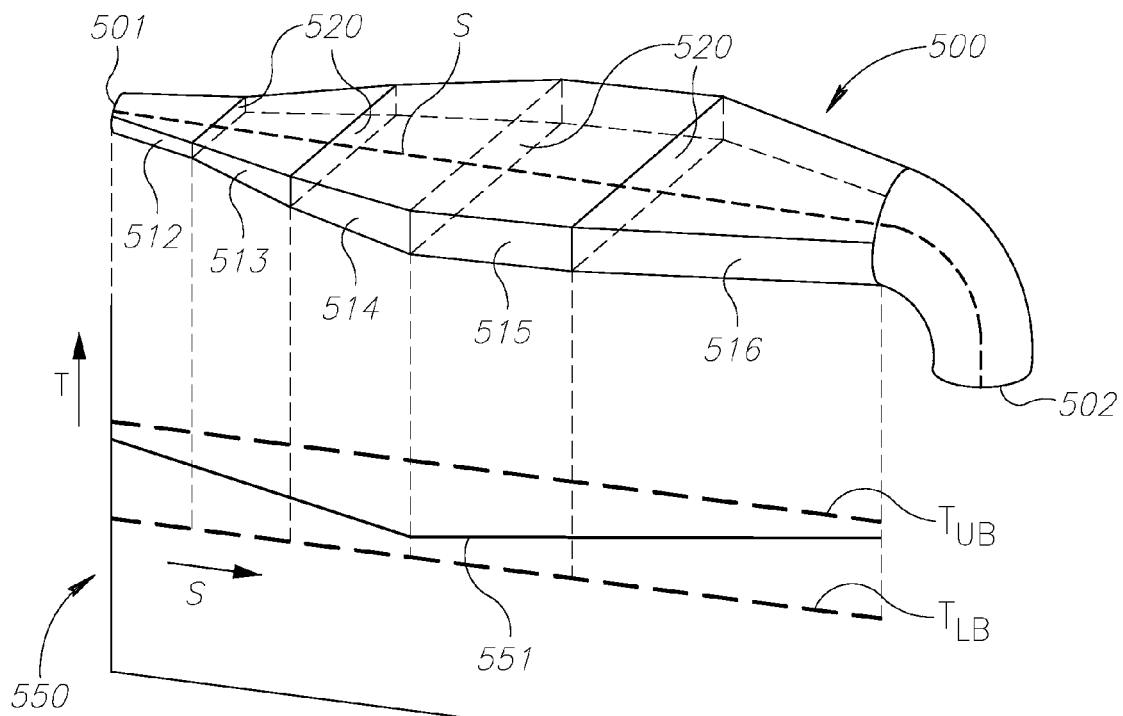
FIG. 5 schematically shows an enhanced surface area contact flow pipe for transporting a gas that is advantageous for maintaining a desired temperature of the gas in accordance with an embodiment of the invention.

FIG. 5 schematically shows another contact flow pipe 500 in accordance with an embodiment of the invention. Contact flow pipe 500 has an axis S, and comprises a relatively small area circular inlet aperture 501 and a relatively large area circular outlet aperture 502. Contact flow pipe 500 may have regions 512, 513, ..., 516. In region 512, the cross section of contact flow pipe 500 morphs from having a substantially circular shape near inlet aperture 501 to a noncircular shape cross section 520 in regions 513, ..., 516. By way of example, the noncircular cross sections 520 are rectangular. Optionally, the area of cross sections 520 increases with proximity of the cross sections to outlet 502 in regions 513 and 514 and remains substantially constant in region 515. In region 516 contact flow pipe 500 may morph to a pipe shape having a relatively large circular cross section substantially equal to that of outlet aperture 502.

In accordance with an embodiment of the invention, a circumference of each cross section 520 is substantially larger than a circumference of a circle having a same area as the cross section 520. Let "$C_R$" represent a ratio of the circumference of a cross section 520 to a circumference of a circle having a same area as the cross section. In an embodiment of the invention $C_R$ is greater than or about equal to 5. Optionally, $C_R$ is greater than or about equal to 10. In some embodiments of the invention $C_R$ is greater than or about equal to 25.

For a given cross section area of a gas flow pipe, molecules of a gas flowing in a pipe having a cross section with a greater circumference collide more frequently with the pipe wall than gas flowing in a pipe having a cross section of smaller circumference. By providing contact flow pipe 500 with cross sections 520 having a relatively large $C_R$ a precursor gas flowing in contact flow pipe 500 may experience an enhanced frequency of collisions with the wall of the contact flow pipe sufficient to moderate changes in temperature of the gas due to changes in volume of the gas.

A graph 550 shows a curve 551 that illustrates, in accordance with an embodiment of the invention, a hypothetical dependence of temperature T of a gas flowing from inlet aperture 501 to outlet aperture 502 of contact flow pipe 500 as a function of s along axis S of the contact flow pipe. By way of example, it is assumed that it is advantageous that the gas remain in a range of temperatures between a temperature lower bound $T_{LB}$ and a temperature upper bound $T_{UB}$ and that the walls of contact flow pipe 500 are maintained at a suitable temperature between $T_{LB}$ and $T_{UB}$, and optionally near $T_{UB}$.

Following entry into contact flow pipe 500 at inlet aperture 501, the volume of the gas expands in regions 512-514 and temperature of the gas decreases as indicated by curve 551. However, because of the relatively large value of $C_R$ for cross sections 520 in regions 512-514 in accordance with an embodiment of the invention, it is expected that the decrease in temperature is smaller than might obtain for a conventional gas flow pipe. In region 515, the volume of the gas is substantially constant and by way of example is assumed to remain substantially constant in region 516. However, because of the increased interaction of the gas with the walls of contact flow pipe 500 resulting from a relatively large value $C_R$ for cross section 520 in regions 515 and 516, temperature of the gas increases relatively quickly to the temperature of the wall of contact flow pipe 500.

Figure 6:
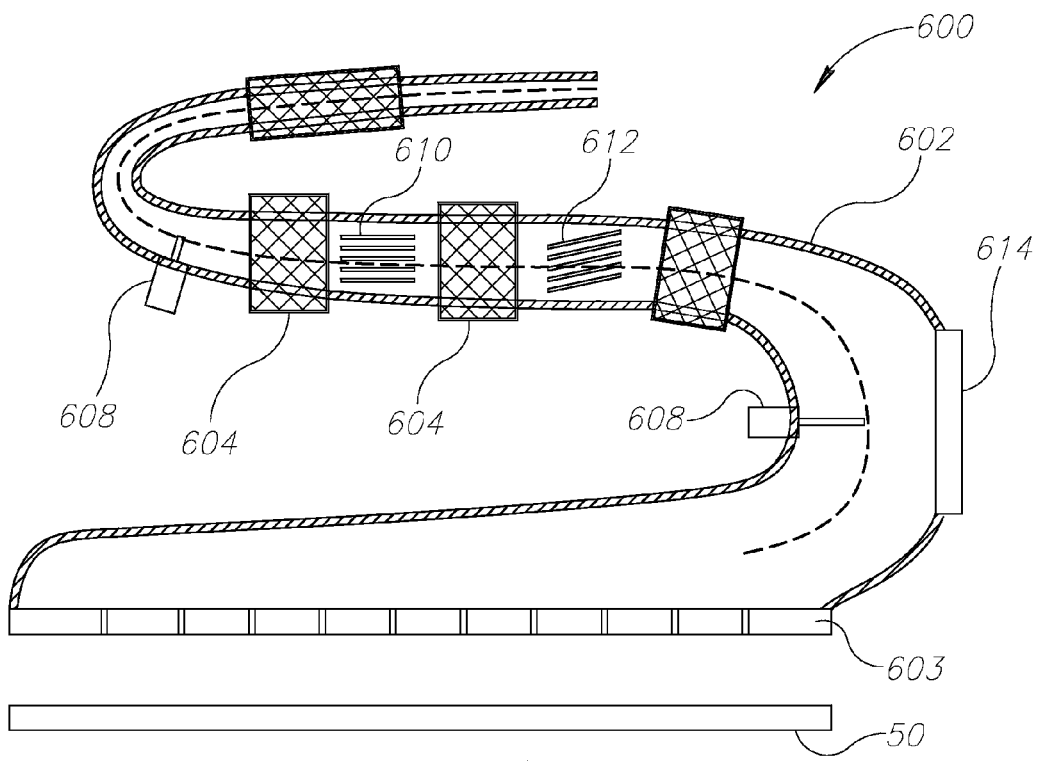
FIG. 6 schematically shows a contact flow pipe having active elements for controlling temperature of a gas flowing in the contact flow pipe in accordance with an embodiment of the invention.

FIG. 6 schematically shows a gas contact flow pipe 600 having a wall 602 and active elements for controlling temperature of a precursor gas flowing in the contact flow pipe, in accordance with an embodiment of the invention. Contact flow pipe 600 is optionally coupled to a gas disperser 603 through which a precursor gas exits the contact flow pipe to flow over a substrate 50.

Contact flow pipe 600 is optionally serpentine and comprises temperature control elements 604 coupled to wall 602 that are controllable by a controller (not shown) to maintain a desired temperature of the wall. Optionally, contact flow pipe 600 comprises temperature sensors 608 configured to acquire measurements of temperature of a precursor gas flowing in the contact flow pipe. In an embodiment, the controller controlling elements 604 controls the elements responsive to temperature measurements acquired by sensors 608. Temperature control elements may be controllable to heat and/or cool wall 602 and may for example comprise a Peltier device.

Optionally, contact flow pipe 600 comprises temperature control fins 610 that may be heated and/or cooled to control temperature of gas flowing in the contact flow pipe. Heating or cooling of a fin may be accomplished by a suitable heating and/or cooing element or device, such as by way of example, temperature control elements 604, thermally coupled to the fin or housed inside the fin. In an embodiment of the invention contact flow pipe 600 comprises cyclone fins 612 that introduce rotary flow to a gas flowing in the contact flow pipe. Optionally, cyclone fins 612 may be heated and/or cooled to control temperature of a gas flowing in the contact flow pipe.

In an embodiment of the invention, contact flow pipe comprises an energy transmission window 614 thru which a source of electromagnetic or acoustic energy may be transmitted from outside the contact flow pipe to a gas flowing in the contact flow pipe. For example, energy transfer window 614 may comprise a thin dielectric window through which electromagnetic energy may be transmitted into contact flow pipe 600. Optionally, the window comprises a microwave antenna on a side of the window facing the lumen of contact flow pipe 600 and a conductive contacts for connecting a microwave power source to the antenna on a side of the window facing away from the lumen.

Figure 7:
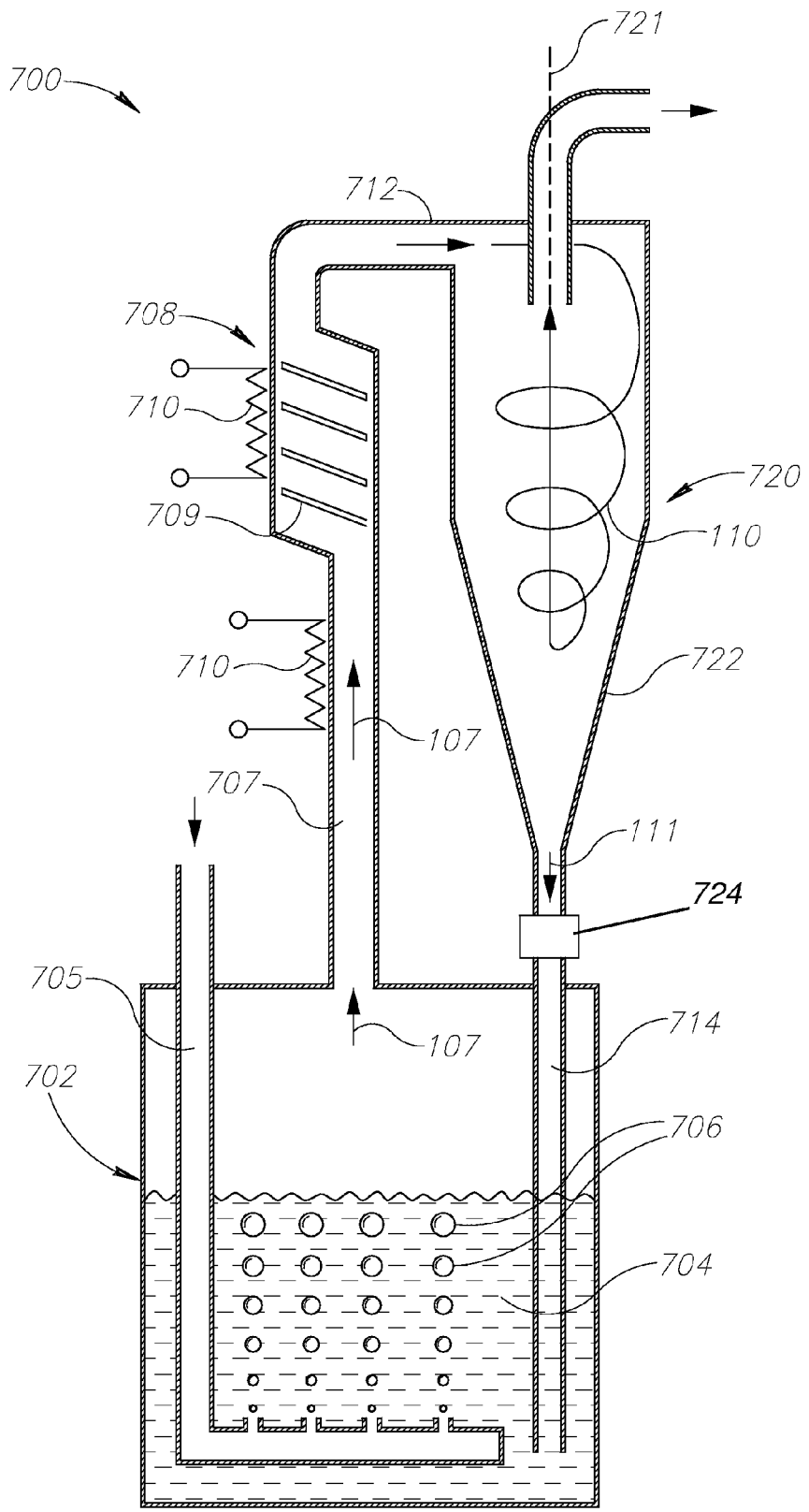
FIG. 7 schematically shows a gas flow system comprising a bubbler for transporting a precursor gas configured to reduce aerosols in the precursor gas flow, in accordance with an embodiment of the invention.

FIG. 7 schematically shows a gas flow bubbler system 700 comprising a bubbler 702 for delivering a precursor gas contained in bubbler 702 as a liquid 704 to a production chamber (not shown) and a cyclone separator 720 for removing aerosols in the precursor gas, in accordance with an embodiment of the invention.

Bubbler system 700 optionally comprises a heater (not shown) that heats liquid 704 to generate precursor gas and a bubbler inlet pipe 705. An inert carrier gas is introduced via inlet pipe 705 to flow through liquid precursor 704 and form bubbles 706 in the liquid precursor that acquire precursor gas generated in the liquid precursor by the heater. Bubbles 706 of carrier gas and precursor flow leave liquid 704 to flow as a gas in a direction indicated by flow arrows 107 that leaves the bubbler via an exit pipe 707 and optionally a rotary flow unit 708 comprising cyclone fins 709. Optionally exit pipe 707 and rotary flow unit 708 are coupled to heaters 710. Heaters 710 heat the gas leaving bubbler 702 to remove aerosol particles in the gas. Cyclone fins 709 in rotary flow unit 708 impart rotary flow to the gas that operates to spin aerosol particles in the gas to the walls of the rotary gas flow unit and flow pipes downstream of the rotary gas flow unit. In collisions of the aerosol particles with the walls and cyclone fins 709 the aerosol particles tend to pick up energy that evaporates and/or sublimates the aerosol particles.

After passing through exit pipe 707 and rotary flow unit 708 the gas of carrier and precursor molecules flows through a bridging pipe 712 coupled to cyclone separator 720. Cyclone separator 720 is substantially rotationally symmetric about an axis 721 and comprises a funnel 722. Bridging pipe 712 is positioned so that gas flowing though bridging pipe 712 enters and flows off center from axis 721 to generate rotational flow of the entering gas relative to the axis. Centrifugal forces generated by the rotational flow of the gas causes aerosol particles carried by the gas to impact the wall of funnel 722 and drip back to precursor liquid 704 in bubbler 702 via a drip pipe 714. Carrier and precursor molecules in the gas are reflected upwards to exit the cyclone separator via a delivery pipe through which the gas, relatively free of aerosol particles flows towards the production chamber. Flow of carrier and precursor gas in cyclone separator 720 is schematically indicated by a curled flow arrow 110. Dripping of aerosol particles to liquid 704 is indicated by an arrow 111 and is facilitated optionally by a pump 724 which aspirates gas from cyclone separator 720 to bubbler 702.

It is noted whereas in the above, a bubbler is used to provide a precursor in a gas phase a sublimation precursor gas generator can be used in place of a bubbler to generate a precursor in a gas phase.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A gas delivery pipe for transmitting a gas, the pipe comprising
   a wall defining a lumen of the pipe;
   an inlet aperture through which gas flows into the pipe;
   an outlet aperture through which gas flows out of the pipe; wherein
   the pipe has an index, SI, characterizing a degree to which the pipe is serpentine that is equal to an integral of an absolute value of changes in angle of direction that a unit vector tangent to a midline of the lumen undergoes in moving along the midline from the inlet to the outlet aperture, which integral has a value greater than or about equal to 180°;
   a ratio, $R_{OI}$, of an area of the outlet aperture divided by the inlet aperture is greater than or equal to about 2, and
   a relative rate of change of area A of cross section of the pipe as a function of displacement s, $(1/A)\partial A/\partial s$, along the midline, is less than or equal to about 0.25.

2. A gas delivery pipe according to claim 1 wherein SI is greater than or about equal to 360°.

3. A gas delivery pipe according to claim 1 wherein SI is greater than or about equal to 720°.

4. A gas delivery pipe according to claim 1 wherein a ratio, $R_{OI}$, of an area of the outlet aperture divided by the inlet aperture is greater than or equal to about 5.

5. A gas delivery pipe according to claim 1 wherein a ratio, $R_{OI}$, of an area of the outlet aperture divided by the inlet aperture is greater than or equal to about 10.

6. A gas delivery pipe according to claim 1 wherein $(1/A)\partial A/\partial s$ is less than or equal to about 0.10.

7. A gas delivery pipe according to claim 1 wherein $(1/A)\partial A/\partial s$ is less than or equal to about 0.05.

8. A gas delivery pipe for transmitting a gas, the pipe comprising
   a wall defining a lumen of the pipe;
   an inlet aperture through which gas flows into the pipe;
   an outlet aperture through which gas flows out of the pipe;
      wherein the pipe has an index, SI, characterizing a degree to which the pipe is serpentine that is equal to an integral of an absolute value of changes in angle of direction that a unit vector tangent to a midline of the lumen undergoes in moving along the midline from the inlet to the outlet aperture, which integral has a value greater than or about equal to 180°, wherein the wall comprises at least one fin that protrudes into the lumen.

9. A gas delivery pipe according to claim 8 and comprising a temperature control element controllable to heat and/or cool the at least one fin.

10. A gas delivery pipe according to claim 8 wherein the at least one fin generates turbulent flow in the gas.

11. A gas delivery pipe according to claim 8 wherein the at least one fin generates rotary flow in the gas.

12. A gas delivery pipe according to claim 8 and comprising at least one temperature sensor that protrudes into the lumen and acquires measurements of temperature of the gas.

13. A gas delivery pipe according to claim 12 and comprising a controller that controls the temperature control element responsive to measurements provided by the at least one temperature sensor.

14. A gas delivery pipe for transmitting a gas, the pipe comprising
   a wall defining a lumen of the pipe;
   an inlet aperture through which gas flows into the pipe;
   an outlet aperture through which gas flows out of the pipe;
      wherein the pipe has an index, SI, characterizing a degree to which the pipe is serpentine that is equal to an integral of an absolute value of changes in angle of direction that a unit vector tangent to a midline of the lumen undergoes in moving along the midline from the inlet to the outlet aperture, which integral has a value greater than or about equal to 180° and comprising a temperature control element controllable to heat and/or cool the wall of the pipe.

15. A gas delivery pipe according to claim 14 and comprising at least one temperature sensor that protrudes into the lumen and acquires measurements of temperature of the gas.

16. A gas delivery pipe according to claim 15 and comprising a controller that controls the temperature control element responsive to measurements provided by the at least one temperature sensor.

17. A gas delivery pipe for transmitting a gas, the pipe comprising
   a wall defining a lumen of the pipe;
   an inlet aperture through which gas flows into the pipe;
   an outlet aperture through which gas flows out of the pipe;
      wherein the pipe has an index, SI, characterizing a degree to which the pipe is serpentine that is equal to an integral of an absolute value of changes in angle of direction that a unit vector tangent to a midline of the lumen undergoes in moving along the midline from the inlet to the outlet aperture, which integral has a value greater than or about equal to 180° and comprising an energy transmission window thru which energy from a source of energy outside the pipe may be transmitted into the lumen.

18. A gas delivery pipe according to claim 17 wherein the source of energy comprises a source of electromagnetic energy.

19. A gas delivery pipe according to claim 17 wherein the source of energy comprises a source of acoustic energy.

* * * * *